(12) United States Patent
Shitomi et al.

(10) Patent No.: US 9,865,513 B2
(45) Date of Patent: Jan. 9, 2018

(54) SEMICONDUCTOR DEVICE MANUFACTURING METHOD

(71) Applicant: Mitsubishi Electric Corporation, Tokyo (JP)

(72) Inventors: Takuichiro Shitomi, Tokyo (JP); Kazuhisa Koga, Fukuoka (JP); Satoshi Rittaku, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/301,488

(22) PCT Filed: May 21, 2014

(86) PCT No.: PCT/JP2014/063499
§ 371 (c)(1),
(2) Date: Oct. 3, 2016

(87) PCT Pub. No.: WO2015/177891
PCT Pub. Date: Nov. 26, 2015

(65) Prior Publication Data
US 2017/0040229 A1    Feb. 9, 2017

(51) Int. Cl.
*H01L 21/66* (2006.01)
*H01L 21/205* (2006.01)
(Continued)

(52) U.S. Cl.
CPC ........ *H01L 22/12* (2013.01); *H01L 21/02274* (2013.01); *H01L 21/205* (2013.01);
(Continued)

(58) Field of Classification Search
CPC ............... H01L 22/12; H01L 21/67248; H01L 21/76801; H01L 21/02274; H01L 21/28008; H01L 21/3213
(Continued)

(56) References Cited

U.S. PATENT DOCUMENTS

| 7,037,733 B2 * | 5/2006 | Shibata ................. G01J 5/0003 374/126 |
| 2004/0023421 A1 | 2/2004 | Shibata et al. |
| 2009/0219969 A1 | 9/2009 | Yamamoto |

FOREIGN PATENT DOCUMENTS

| JP | H07-159246 A | 6/1995 |
| JP | 2009-212199 A | 9/2009 |
| WO | 03/038384 A1 | 5/2003 |

OTHER PUBLICATIONS

Notification of Transmittal of Translation of the International Preliminary Report on Patentability and Translation of Written Opinion of the International Searching Authority; PCT/JP2014/063499 dated Dec. 1, 2016.

(Continued)

*Primary Examiner* — Vu A Vu
(74) *Attorney, Agent, or Firm* — Studebaker & Brackett PC

(57) ABSTRACT

A semiconductor device manufacturing method includes an element forming step of forming an element structure on a front surface of a substrate and forming a back structure on a back surface of the substrate, and a film forming step of performing film forming on a front surface of the element structure while measuring the temperature of the substrate by using a radiation thermometer that applies infrared rays of a wavelength $\lambda i$ to the back structure to obtain an infrared emissivity of the substrate. The back structure has a first layer exposed to the outside and a second layer in contact with the first layer, the refractive index of the second layer being smaller than that of the first layer, and the layer thickness of the first layer is set in a range from $(2n-1)\lambda i/8$ to $(2n+1)\lambda i/8$, with n being a positive even number.

6 Claims, 4 Drawing Sheets

(51) Int. Cl.
    *H01L 21/02*      (2006.01)
    *H01L 21/28*      (2006.01)
    *H01L 21/3213*    (2006.01)
    *H01L 21/67*      (2006.01)
    *H01L 21/768*     (2006.01)

(52) U.S. Cl.
    CPC .... *H01L 21/28008* (2013.01); *H01L 21/3213* (2013.01); *H01L 21/67248* (2013.01); *H01L 21/76801* (2013.01)

(58) Field of Classification Search
    USPC .......................................................... 438/16
    See application file for complete search history.

(56) References Cited

OTHER PUBLICATIONS

International Search Report issued in PCT/JP2014/063499; dated Aug. 19, 2014.

\* cited by examiner

Thickness of the First layer (d x)

SEMICONDUCTOR DEVICE MANUFACTURING METHOD

TECHNICAL FIELD

This invention relates to a semiconductor device manufacturing method in which film forming is performed on a substrate while monitoring the substrate temperature with a radiation thermometer.

BACKGROUND

Patent Literature 1 discloses measurement of substrate temperature with a radiation thermometer.

PRIOR ART

Patent Literature

Patent Literature 1: Japanese Patent Laid-Open No. H07-159246

SUMMARY

Technical Problem

At the time of film forming, for example, by high-density plasma chemical vapor deposition (high-density plasma CVD), sputtering, thermal CVD or the like, the process is advanced while the temperature of a processing object (a substrate) is being monitored with a radiation thermometer in order to obtain the desired film characteristics (e.g., a resistivity and a reflectance).

The infrared emissivity and the amount of infrared emission energy from the processing object are measured with the radiation thermometer to measure the substrate temperature. If the intensity of infrared rays incident on the back surface of the processing object is X and the intensity of reflected rays is Y, the infrared emissivity is defined by X−Y. If there are a plurality of groups of reflected rays, the intensity Y of reflected rays is a superimposition of the plurality of groups of reflected rays.

When the plurality of groups of reflected rays interfere with and intensify each other, the value of Y is increased and as a result the value of infrared emissivity is reduced. There is a problem that when the value of infrared emissivity is reduced in this way, temperature measurement cannot be performed with high accuracy. Some processing apparatuses operate so as to recognize monitoring failure when the value of infrared emissivity is reduced and set an interlock to stop processing.

The present invention has been achieved to solve the above-described problem, and an object of the present invention is to provide a semiconductor device manufacturing method that enables inhibiting a plurality of groups of reflected rays from interfering with and intensifying each other when the infrared emissivity of a processing object is measured by using a radiation thermometer.

Means for Solving the Problems

According to one aspect of the present invention, a semiconductor device manufacturing method includes an element forming step of forming an element structure on a front surface of a substrate and forming a back structure on a back surface of the substrate, and a film forming step of performing film forming on a front surface of the element structure while measuring the temperature of the substrate by using a radiation thermometer that applies infrared rays of a wavelength $\lambda i$ to the back structure to obtain an infrared emissivity of the substrate, wherein the back structure has a first layer exposed to the outside and a second layer in contact with the first layer, the refractive index of the second layer being smaller than that of the first layer, and wherein in the film forming step, the layer thickness of the first layer is set in a range from $(2n-1)\lambda i/8$ to $(2n+1)\lambda i/8$, with n being a positive even number.

According to another aspect of the present invention, a semiconductor device manufacturing method includes an element forming step of forming an element structure on a front surface of a substrate and forming a back structure on a back surface of the substrate, and a film forming step of performing film forming on a front surface of the element structure while measuring the temperature of the substrate by using a radiation thermometer that applies infrared rays of a wavelength $\lambda i$ to the back structure to obtain the infrared emissivity of the substrate, wherein the back structure has a first layer exposed to the outside and a second layer in contact with the first layer, the refractive index of the second layer being larger than that of the first layer, and wherein in the film forming step, the layer thickness of the first layer is set in a range from $(2n-1)\lambda i/8$ to $(2n+1)\lambda i/8$, with n being a positive odd number.

According to another aspect of the present invention, a semiconductor device manufacturing method includes an element forming step of forming an element structure on a front surface of a substrate and forming a back structure on a back surface of the substrate, and a film forming step of performing film forming on a front surface of the element structure while measuring the temperature of the substrate by using a radiation thermometer that applies infrared rays to the back structure to obtain the infrared emissivity of the substrate, wherein, in the element forming step, a part of layers formed on the back surface side of the substrate is removed so that the back structure is uniform in refractive index at the end of the element forming step.

Other features of the present invention will be made clear below.

Advantageous Effects of Invention

According to this invention, the back structure of the processing object is modified, thereby enabling inhibiting a plurality of groups of reflected rays from interfering with and intensifying each other when the infrared emissivity of the processing object is measured with the radiation thermometer.

DESCRIPTION OF EMBODIMENTS

Figure 1:
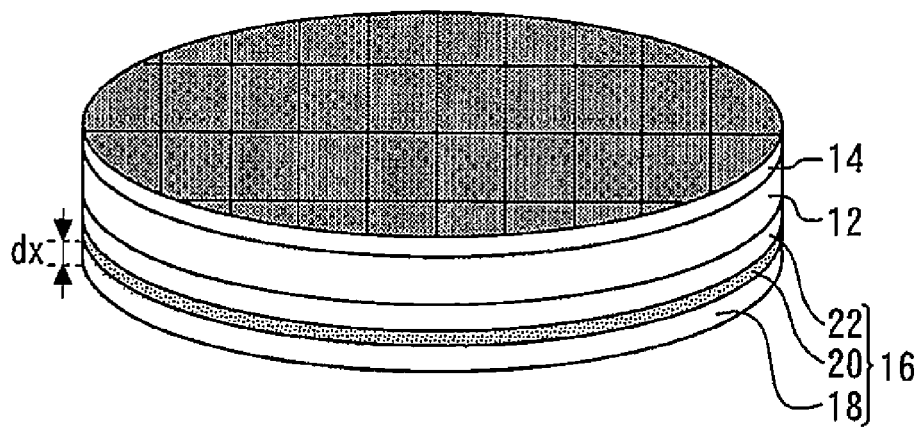
FIG. 1 is a perspective view of a processing object after the element forming step of the embodiment 1.

A semiconductor device manufacturing method according to an embodiment of the present invention will be described with reference to the drawings. Components identical or corresponding to each other are assigned the same reference characters and repeated description of them is omitted in some cases.

Embodiment 1

In a semiconductor device manufacturing method according to Embodiment 1 of the present invention, an element forming step is first performed. FIG. 1 is a perspective view of a processing object 10 (wafer) after the element forming step. The processing object 10 has a substrate 12 formed of silicon. In the element forming step, processing including CVD, ion implantation, heat treatment, sputtering, photolithography and etching is performed on the substrate 12, thereby forming an element structure 14 on a front surface of the substrate 12. The element structure 14 includes a transistor, a resistance element and a capacitor and forms an integrated circuit (IC) as a whole. A wiring layer is formed as the uppermost layer of the element structure 14.

With the formation of the element structure 14, a back structure 16 is formed on a back surface of the substrate 12. The back structure 16 has a first layer 18, a second layer 20 and a third layer 22. The first layer 18 is polysilicon exposed to the outside. The first layer 18 is formed at the time of film forming of a material for the resistance element. That is, the first layer 18 is necessarily formed on the back surface side of the substrate 12 when the resistance element is formed on the front surface side of the substrate 12. The layer thickness of the first layer 18 is dx. By adjusting the film thickness of the material of the resistance element, the layer thickness dx of the first layer 18 is set in the range from $(2n-1)\lambda i/8$ to $(2n+1)\lambda i/8$, with n being a positive even number. $\lambda i$ is the wavelength of infrared rays radiated from a radiation thermometer.

The second layer 20 is a silicon oxide film adjacent to the first layer 18. The second layer 20 is formed at the time of film forming of an oxide film for patterning the gate electrode of the transistor. That is, the second layer 20 is necessarily formed on the back surface side of the substrate 12 when the transistor is formed on the front surface side of the substrate 12. This silicon oxide film is, for example, Tetra Ethyl OrthoSilicate (TEOS). The refractive index of the second layer 20 is therefore smaller than that of the first layer 18.

The third layer 22 is polysilicon between the second layer 20 and the substrate 12. The third layer 22 is formed at the time of film forming for the gate electrode of the transistor in the element structure 14. That is, the third layer 22 is necessarily formed on the back surface side of the substrate 12 when the transistor is formed on the front surface side of the substrate 12. Thus, the back structure 16 is necessarily formed accompanying the formation of the element structure 14. Thus, the element forming step is a step in which the element structure 14 is formed on the surface of the substrate 12 while the back structure 16 is formed on the back surface of the substrate 12.

Figure 2:
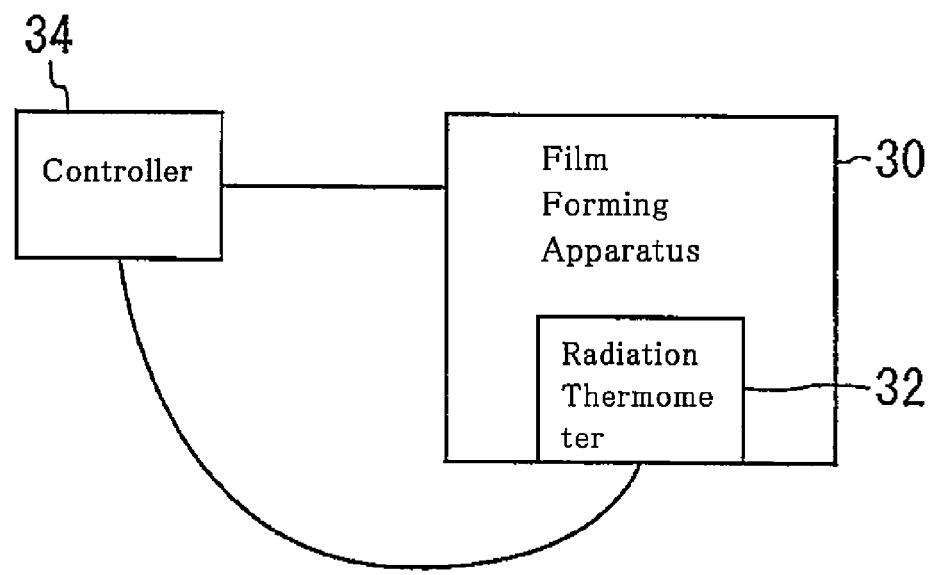
FIG. 2 is a block diagram showing an apparatus used in the film forming step.

Subsequently, the process is advanced to a film forming step in which film forming is performed on the front surface of the element structure 14. FIG. 2 is a block diagram showing an apparatus used in the film forming step. In a film forming apparatus 30, a radiation thermometer 32 is provided, with which the temperature of the substrate 12 is measured. A controller 34 controls the film forming apparatus 30 while monitoring the substrate temperature measured with the radiation thermometer 32.

Figure 3:
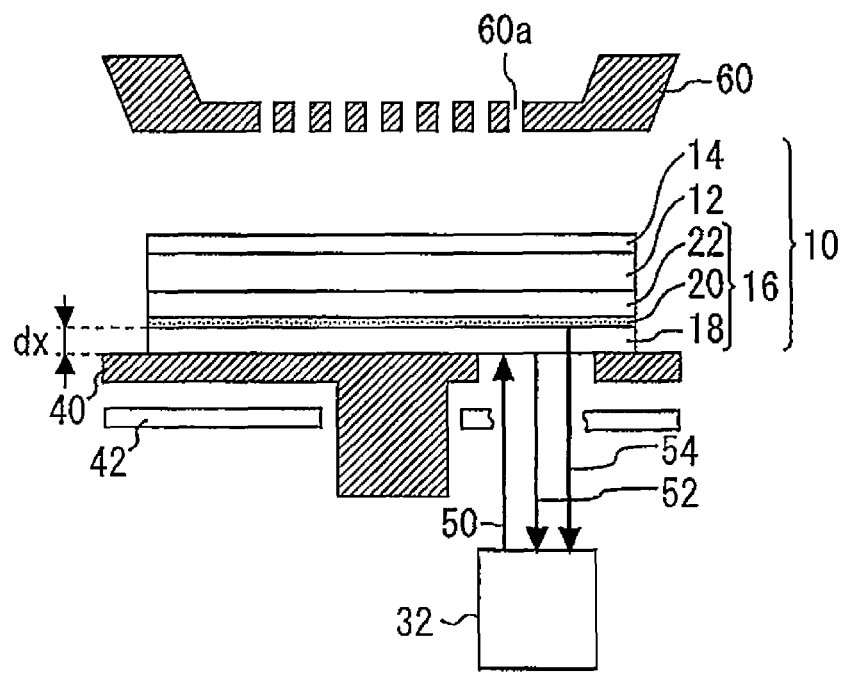
FIG. 3 is a diagram showing internal portions of the film forming apparatus in the film forming step.

FIG. 3 is a diagram showing internal portions of the film forming apparatus in the film forming step. The processing object 10 is placed on a stage 40. An electrode 60 exists above the stage 40. A material gas is supplied from slits 60a in the electrode 60 to a region above the processing object 10 while alternating-current power is being applied to the electrode 60, thus forming an interlayer insulating film for a wiring layer by high-density plasma CVD.

In the film forming step, the processing object 10 is cooled through the stage 40 by a cooling device 42 provided below the stage 40. The cooling device 42 is controlled by the controller 34 to prevent the temperature of the processing object 10 from becoming excessively high during film forming and to thereby maintain the temperature at or below a certain point. The cooling device 42 may be provided in the stage 40.

In forming the interlayer insulating film having the desired characteristics, it is important to maintain the temperature of the processing object 10 at the desired value in the film forming step. Then, in the film forming step, the temperature of the substrate 12 (processing object 10) is measured with the radiation thermometer 32 while the interlayer insulating film is being formed. With the radiation thermometer 32, the infrared emissivity and the amount of infrared emission energy from the processing object 10 are measured and the temperature of the processing object 10 is computed.

Measurement of the infrared emissivity with the radiation thermometer 32 will be described. Infrared rays 50 of wavelength $\lambda i$ are applied from the radiation thermometer 32 to the back structure 16. The radiation thermometer 32 senses the intensities of reflected rays 52 and 54 of the infrared rays 50. The intensities of reflected rays 52 and 54 are subtracted from the intensity of the infrared rays 50 to obtain the infrared emissivity of the substrate 12. The degree of shielding of infrared rays at the surface of the processing object is measured as a simulated value by measuring the intensities of the reflected rays 52 and 54.

The refractive index of the first layer 18 is larger than that of a vacuum or atmospheric air. Therefore the reflected rays 52 are reflected rays fixed-boundary-reflected from the interface between a vacuum or atmospheric air and the first layer 18. Accordingly, the reflected rays 52 are phase-shifted by ½ of the wavelength with respect to the incident rays, i.e., the infrared rays 50.

The refractive index of the first layer 18 formed of polysilicon is larger than that of the second layer 20 formed of silicon oxide film. Therefore the reflected rays 54 are reflected rays free-boundary-reflected from the interface between the first layer 18 and the second layer 20. Accordingly, the reflected rays 54 are not phase-shifted with respect to the incident rays, i.e., the infrared rays 50.

As a result, the phase difference between the reflected rays 52 and the reflected rays 54 is the sum of the ½ wavelength ($\lambda i/2$) and 2dx (twice the layer thickness of the first layer 18). For example, if the layer thickness dx of the first layer 18 is an odd multiple of $(¼)\lambda i$, the phase difference between the reflected rays 52 and the reflected rays 54 is an integer multiple of λi and interference occurs such that the reflected rays 52 and the reflected rays 54 intensify each other. In this case, the intensity Y of the reflected rays is increased and the value of infrared emissivity (X−Y) is extremely reduced.

On the other hand, if the layer thickness dx of the first layer 18 is an integer multiple of (½)λi, the phase difference between the reflected rays 52 and the reflected rays 54 is an integer multiple of (½)λi and interference occurs such that the reflected rays 52 and the reflected rays 54 weaken each other. In this case, the intensity Y of the reflected rays can be reduced so that the value of infrared emissivity (X−Y) is sufficiently large. In Embodiment 1 of the present invention, therefore, the layer thickness dx of the first layer 18 is set in the range from (2n−1)λi/8 to (2n+1)λi/8, with n being a positive even number. This range of layer thickness dx is a range whose center is an integer multiple of (½)λi, and which extends by (⅛)λi from this value in the increasing and decreasing directions. This is a range for avoiding odd multiples of (¼)λi. Thus it is possible to inhibit the plurality of groups of reflected rays from interfering with and intensifying each other when the infrared emissivity of the processing object 10 is measured.

The temperature of the processing object 10 is obtained from the infrared emissivity obtained while interference causing mutual intensification between the reflected rays is inhibited and the amount of infrared emission energy from the processing object. The controller 34 executes the film forming step while confirming that the temperature of the processing object 10 is maintained at the desired temperature.

The semiconductor device manufacturing method according to Embodiment 1 of the present invention is characterized in that the layer thickness of the first layer in the film forming step is set in the range from (2n−1)λi/8 to (2n+1)λi/8, with n being a positive even number. When the first layer 18 has a layer thickness in this range, mutual intensification by interference between a plurality of groups of reflected rays can be avoided and the infrared emissivity can be maintained high. This range of layer thickness dx is therefore referred to as a high-emissivity range.

Figure 4:
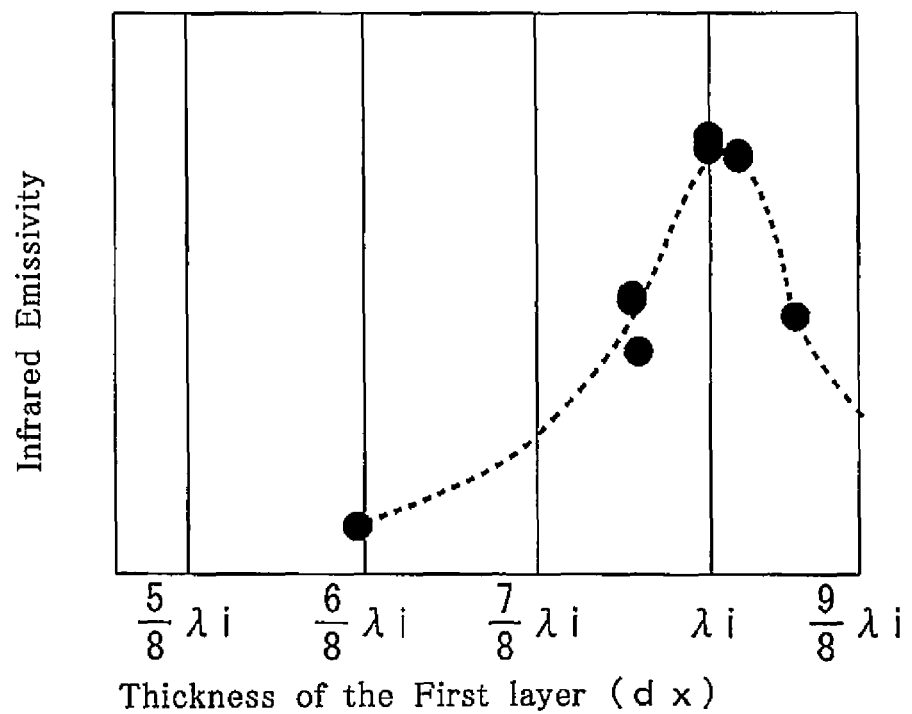
FIG. 4 is a diagram showing the relationship between the layer thickness of the first layer and the infrared emissivity.

FIG. 4 is a diagram showing the relationship between the layer thickness dx of the first layer 18 and the infrared emissivity. Data plotted with black spots is actual measurement data. The broken line is an approximate curve. At a point at which the layer thickness of the first layer is λi (or an integer multiple of (½)λi), the infrared emissivity has a maximum value. At a point at which the layer thickness of the first layer is (⅝)λi (or an odd multiple of (¼)λi), the infrared emissivity has a minimum value. In FIG. 4, the range from (⅞)λi to (⅝)λi is a high-emissivity range. It can be understood that, in this range, the infrared emissivity can be maintained high by inhibiting the reflected rays from interfering with and intensifying each other.

As long as the back structure 16 can be formed by the process of forming the element structure 14, the process is not specified particularly restrictively. The back structure 16 is not limited to the structure having the first to third layers 18, 20, and 22. Various modifications can be made to the back structure as long as the structure has the first layer exposed to the outside and the second layer whose refractive index is smaller than that of the first layer. For example, the first layer may be formed of a material other than polysilicon, and the second layer may be formed of a material (such as silicon nitride film) other than silicon oxide film.

Since the interface between the second layer 20 and the third layer 22 exists in the back structure 16, reflected rays from this interface also are also thought to exist. If this group of reflected rays significantly contributes to the intensity Y of reflected rays, the layer thickness of the second layer may be adjusted to prevent the occurrence of interference causing mutual intensification between a plurality of groups of rays. However, results of an experiment made by the inventor of the present invention showed that reflected rays from the interface between the second layer 20 and the third layer 22 did not significantly contribute to the intensity Y of reflected rays. Moreover, the element forming step is complicated if the layer thickness of the second layer is adjusted. In Embodiment 1 of the present invention, therefore, only the layer thickness of the first layer 18 is adjusted.

In Embodiment 1 of the present invention, the film thickness of the material of the resistance element is adjusted to set the layer thickness of the first layer 18 in the above-described high-emissivity range. Even in a case where the layer thickness of the first layer is not in the high-emissivity range at the end of the element forming step, the first layer may be made thinner so that the layer thickness of the first layer falls into the high-emissivity range before the film forming step. That is, before the film forming step, a film thickness reducing step may be provided in which the layer thickness of the first layer is reduced so that the layer thickness of the first layer is in the range from (2n−1)λi/8 to (2n+1)λi/8, with n being a positive even number.

The controller 34 may not only monitor the temperature of the processing object 10, but also adjust the state of energization of the cooling device 42, for example, on the basis of the temperature of the processing object 10 so that the temperature of the processing object 10 is constantly maintained.

In the film forming step, an interlayer insulating film is formed by high-density plasma CVD. In the film forming step, however, a different film may be formed by a different method as long as film forming is performed while the substrate temperature is being monitored with a radiation thermometer.

These modifications may be applied as desired to semiconductor device manufacturing methods according to embodiments described below. The semiconductor device manufacturing methods according to the embodiments described below each have a number of commonalities with Embodiment 1 and will therefore be described mainly with respect to points of difference from Embodiment 1.

Embodiment 2

Figure 5:
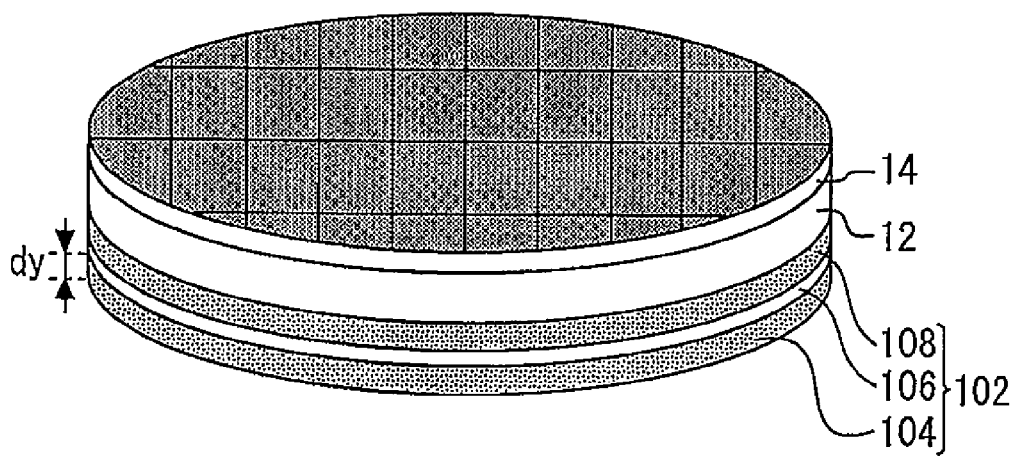
FIG. 5 is a perspective view of a processing object after element forming step of Embodiment 2.

FIG. 5 is a perspective view of a processing object 100 according to Embodiment 2 of the present invention. A back structure 102 has a first layer 104, a second layer 106 and a third layer 108. The first layer 104 is a silicon oxide film exposed to the outside. The second layer 106 is polysilicon in contact with the first layer 104. The refractive index of the second layer 106 (polysilicon) is larger than that of the first layer 104 (silicon oxide layer). The third layer 108 is a silicon oxide film between the second layer 106 and the substrate 12. The back structure 102 is formed when the element structure 14 is formed in the element forming step.

By adjusting the film thickness of the silicon oxide film formed in the element forming step, the layer thickness dy of the first layer 104 is set in the range from (2n−1)λi/8 to (2n+1)λi/8, with n being a positive odd number.

Figure 6:
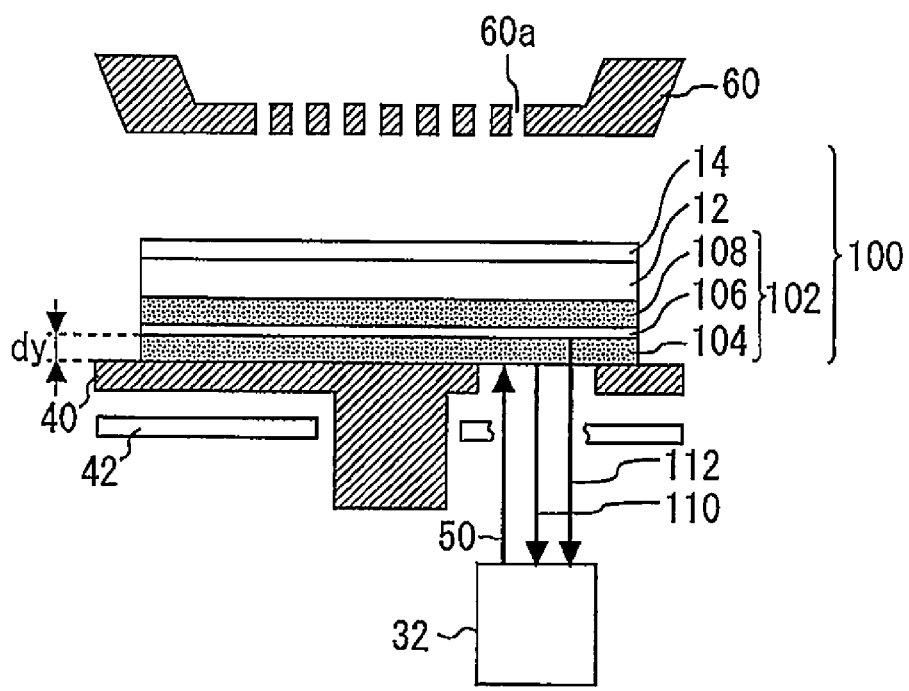
FIG. 6 is a diagram showing internal portions of the film forming apparatus in the film forming step.

FIG. 6 is a diagram showing internal portions of the film forming apparatus in the film forming step. Infrared rays 50 of wavelength λi are applied from the radiation thermometer 32 to the back structure 102. Then, the radiation thermometer 32 senses the intensities of reflected rays 110 and 112.

The reflected rays 110 are reflected rays fixed-boundary-reflected from the interface between a vacuum or atmospheric air and the first layer 104. Accordingly, the reflected rays 110 are phase-shifted by ½ of the wavelength with respect to the incident rays, i.e., the infrared rays 50.

The refractive index of the second layer 106 formed of polysilicon is larger than that of the first layer 104 formed of silicon oxide film. Therefore the reflected rays 112 are reflected rays fixed-boundary-reflected from the interface between the first layer 104 and the second layer 106. Accordingly, the reflected rays 112 are phase-shifted by ½ of the wavelength with respect to the incident rays, i.e., the infrared rays 50.

As a result, the phase difference between the reflected rays 110 and the reflected rays 112 is 2dy (twice the layer thickness of the first layer 104). If the layer thickness dy of the first layer 104 is an integer multiple of $(½)λi$, the phase difference between the reflected rays 110 and the reflected rays 112 is an integer multiple of $λi$ and interference occurs such that the reflected rays 110 and the reflected rays 112 intensify each other.

On the other hand, if the layer thickness dy of the first layer 104 is an odd multiple of $(¼)λi$, the phase difference between the reflected rays 110 and the reflected rays 112 is an integer multiple of $(½)λi$ and interference occurs such that the reflected rays 110 and the reflected rays 112 weaken each other. In this case, the intensity Y of the reflected rays can be reduced so that the value of infrared emissivity (X-Y) is sufficiently large.

In Embodiment 2 of the present invention, therefore, the layer thickness dy of the first layer 104 is set in the range from $(2n-1)λi/8$ to $(2n+1)λi/8$, with a being a positive odd number. This range of layer thickness is a range whose center is an odd multiple of the (¼) wavelength, and which extends by $(⅛)λi$ from this value in the increasing and decreasing directions. This is a range for avoiding integer multiples of $(½)λi$. Thus it is possible to inhibit the plurality of groups of reflected rays from interfering with and intensifying each other when the infrared emissivity of the processing object 100 is measured.

Before the film forming step, a film thickness reducing step may be provided to reduce the layer thickness of the first layer 104 so that the layer thickness of the first layer 104 is in the range from $(2n-1)λi/8$ to $(2n+1)λi/8$, with n being a positive odd number.

Embodiment 3

Keeping the infrared emissivity high by adjusting the layer thickness of the first layer has been described in the descriptions of Embodiments 1 and 2. The reason that a need arises to adjust the layer thickness of the first layer is that the back structure is constituted of a plurality of layers having refractive indices different from each other. In Embodiment 3, a back structure is made uniform in refractive index in the film forming step.

Figure 7:
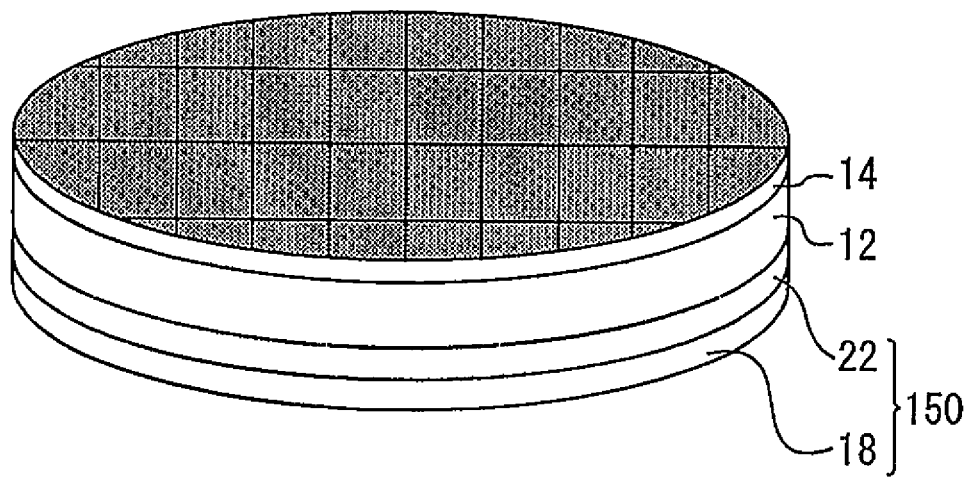
FIG. 7 is a perspective view of a processing object at the time of completion of the element forming step in Embodiment 3.

FIG. 7 is a perspective view of a processing object at the time of completion of the element forming step in Embodiment 3. In the element forming step, part of layers formed on the back surface side of the substrate 12 is removed so that a back structure 150 is uniform in refractive index at the end of the element forming step. That is, the second layer 20 in FIG. 1 is removed in the element forming step to leave only the first layer 18 and the third layer 22 in the back structure 150. The back structure 150 formed only of polysilicon can thus be obtained.

When infrared rays are applied from the radiation thermometer to the back structure 150 in the film forming step, only reflected rays from the interface between a vacuum or atmospheric air and the first layer 18 can be detected. Mutual intensification by interference between a plurality of groups of reflected rays can thus be inhibited.

Figure 8:
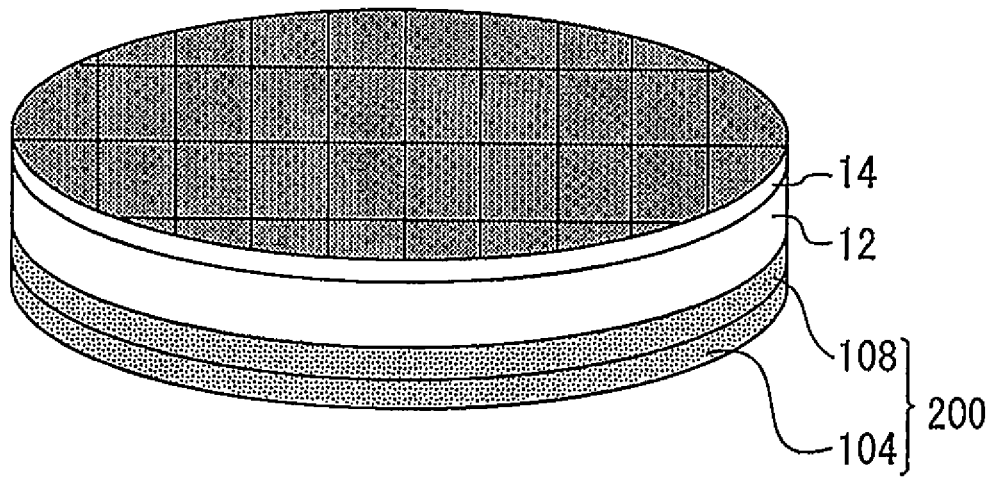
FIG. 8 is a perspective view of processing object of the modified example.

The semiconductor device manufacturing method according to Embodiment 3 of the present invention makes the back structure uniform in refractive index to eliminate interference reflection in the back structure. Various modifications can be made within such a scope as not to lose this feature. For example, as shown in FIG. 8, only the first layer 104 and the third layer 108 formed of silicon oxide film may constitute a back structure 200. In this case, the second layer 106 in FIG. 5 is removed in the element forming step. The back structure in the film forming step may be formed silicon nitride film or the like instead of being formed exclusively of polysilicon or silicon oxide film.

DESCRIPTION OF SYMBOLS 10 processing object, 12 substrate, 14 element structure, 16 back structure, 18 first layer, 20 second layer, 22 third layer, 30 film forming apparatus, 32 radiation thermometer, 34 controller, 40 stage, 42 cooling device, 50 infrared rays, 52,54 reflected rays, 60 electrode, 60a slits, 100 processing object, 102,150,200 back structure, 110.112 reflected rays

The invention claimed is:

1. A semiconductor device manufacturing method, comprising:
   an element forming step of forming an element structure on a front surface of a substrate and forming a back structure on a back surface of the substrate; and
   a film forming step of performing film forming on a front surface of the element structure while measuring the temperature of the substrate by using a radiation thermometer that applies infrared rays of a wavelength $λi$ to the back structure to obtain an infrared emissivity of the substrate,
   wherein the back structure has a first layer exposed to the outside and a second layer in contact with the first layer, the refractive index of the second layer being smaller than that of the first layer, and
   wherein in the film forming step, the layer thickness of the first layer is set in a range from $(2n-1)λi/8$ to $(2n+1)λi/8$, with n being a positive even number.

2. The semiconductor device manufacturing method according to claim 1, wherein the element structure includes a transistor and a resistance element;
   the back structure has a third layer between the second layer and the substrate;
   the third layer is polysilicon formed at the time of film forming for a gate electrode of the transistor;
   the second layer is a silicon oxide film formed at the time of film forming of an oxide film for patterning the gate electrode; and
   the first layer is polysilicon formed at the time of film forming of a material for the resistance element.

3. The semiconductor device manufacturing method according to claim 1, further comprising, as a step before the film forming step, a film thickness reducing step of reducing the layer thickness of the first layer so that the layer thickness of the first layer is in the range from $(2n-1)λi/8$ to $(2n+1)λi/8$, with n being a positive even number.

4. A semiconductor device manufacturing method, comprising:

an element forming step of forming an element structure on a front surface of a substrate and forming a back structure on a back surface of the substrate; and a film forming step of performing film forming on a front surface of the element structure while measuring the temperature of the substrate by using a radiation thermometer that applies infrared rays of a wavelength $\lambda i$ to the back structure to obtain the infrared emissivity of the substrate, wherein the back structure has a first layer exposed to the outside and a second layer in contact with the first layer, the refractive index of the second layer being larger than that of the first layer, and wherein in the film forming step, the layer thickness of the first layer is set in a range from $(2n-1)\lambda i/8$ to $(2n+1)\lambda i/8$, with n being a positive odd number.

5. The semiconductor device manufacturing method according to claim 4, further comprising, as a step before the film forming step, a film thickness reducing step of reducing the layer thickness of the first layer so that the layer thickness of the first layer is in the range from $(2n-1)\lambda i/8$ to $(2n+1)\lambda i/8$, with n being a positive odd number.

6. The semiconductor device manufacturing method according to claim 1, wherein the element structure has a wiring layer, and wherein, in the film forming step, an interlayer insulating film for the wiring layer is formed by high-density plasma CVD.

* * * * *